US006960524B2

(12) United States Patent
Hecht et al.

(10) Patent No.: US 6,960,524 B2
(45) Date of Patent: Nov. 1, 2005

(54) METHOD FOR PRODUCTION OF A METALLIC OR METAL-CONTAINING LAYER

(75) Inventors: Thomas Hecht, Dresden (DE); Bernhard Sell, Portland, OR (US); Annette Saenger, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/692,150

(22) Filed: Oct. 21, 2003

(65) Prior Publication Data

US 2004/0132313 A1 Jul. 8, 2004

Related U.S. Application Data

(63) Continuation of application No. PCT/EP02/04521, filed on Apr. 24, 2002.

(30) Foreign Application Priority Data

Apr. 30, 2001 (DE) ........................................ 101 21 132

(51) Int. Cl.$^{7}$ ................................................ H01L 21/44

(52) U.S. Cl. ....................... 438/653; 438/643; 438/627; 257/751

(58) Field of Search ................................. 438/653, 643, 438/626–627, 778–779; 257/751

(56) References Cited

U.S. PATENT DOCUMENTS

| | | | | | |
|---|---|---|---|---|---|
| 5,654,233 | A | | 8/1997 | Yu | |
| 6,077,774 | A | * | 6/2000 | Hong et al. | 438/643 |
| 6,139,700 | A | | 10/2000 | Kang et al. | |
| 6,144,060 | A | | 11/2000 | Park et al. | |
| 6,203,613 | B1 | * | 3/2001 | Gates et al. | 117/104 |
| 6,800,521 | B2 | * | 10/2004 | Marsh | 438/253 |

FOREIGN PATENT DOCUMENTS

| | | | |
|---|---|---|---|
| DE | 198 20 147 | A1 | 7/1999 |
| DE | 198 53 598 | A1 | 2/2000 |
| DE | 101 21 132 | A1 | 10/2002 |
| WO | WO 00/06795 | | 2/2000 |

* cited by examiner

*Primary Examiner*—Dung A. Le

(74) *Attorney, Agent, or Firm*—Jenkins, Wilson & Taylor, P.A.

(57) ABSTRACT

The invention relates to a method for production of a metallic or metal-containing layer (5) by using a pre-cursor on a silicon- or germanium-containing layer, of, in particular, an electronic component, whereby an intermediate layer is applied to the silicon- or germanium-containing layer before the use of the pre-cursor. Said intermediate layer forms a diffusion barrier for at least those elements or the pre-cursor which would etch the silicon- or germanium-containing layer and is itself resistant to etching by the pre-cursor.

9 Claims, 2 Drawing Sheets

METHOD FOR PRODUCTION OF A METALLIC OR METAL-CONTAINING LAYER

RELATED APPLICATIONS

This application is a continuation of PCT patent application number PCT/EP02/04521, filed Apr. 24, 2002, which claims priority to German patent application number 10121132.5, filed Apr. 30, 2001, the disclosures of each of which are incorporated herein by reference in their entirety.

TECHNICAL FIELD

Method for production of a metallic or metal-containing layer using a precursor on a silicon- or germanium-containing layer of, in particular, an electronic component.

BACKGROUND ART

The present invention relates to a method for production of a metallic or metal-containing layer using a precursor on a silicon- or germanium-containing layer of, in particular, an electronic component in accordance with the preamble of claim 1, as disclosed in U.S. Pat. No. 5,654,233.

WO 00/06795 discloses a method for production of a metallic layer and a corresponding electronic component, a layer made of amorphous silicon being applied which protects the silicon oxide substrate against the corrosive action of the precursor $WF_6$.

Precursors, primarily fluorine-containing precursors, are often used for depositing metals on silicon- or germanium-containing substances. This deposition technique is sufficiently well known. What is disadvantageous in this case, however, is that many of the precursors used in this case, in particular the fluorine-containing precursors, react with the silicon- or germanium-containing substrate or wafer surface. In the case of silicon-containing substrates, e.g. volatile $SiF_4$ is produced when using a fluorine-containing precursor. The substrate is incipiently etched in this case. Both during the deposition of the metallic or metal-containing layer or structure as a metal electrode for gates or capacitors and during the deposition of said layer for contact hole fillings, this leads to the destruction of the structure and hence of the electronic component which is intended to be formed using this layer structure.

The invention is thus based on the problem of specifying a method which enables production of a metallic or metal-containing layer using a precursor without the disadvantages mentioned in the introduction.

In order to solve this problem a method in accordance with claim 1 is provided.

SUMMARY OF THE INVENTION

The present method according to the invention advantageously proposes a surface treatment of the silicon- or germanium-containing layer surface, which surface treatment precedes the actual layer production, by application of a thin intermediate layer which protects the surface of the underlying layer against the attack of the precursors and seals the substrate at least in the region where the precursor can attack. According to the invention, what is involved in this case is a layer which acts as a diffusion barrier for that chemical species of the precursor which causes the silicon or germanium etching. Furthermore, the layer used is etching-resistant relative to the attack of the precursors, i.e. it is not itself incipiently etched. After this "sealing layer" has been applied, the actual layer production can be effected without any problems; impairment of the silicon- or germanium-containing layer lying under the very thin intermediate layer is precluded. Consequently, the precursors that have already proven worthwhile for layer deposition can be used for the metal deposition without having to attend to influencing or destruction of the layer structure to be produced or of the component. Furthermore, it is possible to have recourse to known deposition techniques and tools, which greatly reduces the fabrication costs.

The method according to the invention makes it possible e.g. to deposit metal electrodes on thin silicon- or germanium-containing dielectrics using the precursors. Thus, it is possible e.g. to deposit a very thin intermediate layer on gate oxides in order subsequently to perform the metal deposition. In this way, it is possible to retain the good interfacial properties between $SiO_2$ and the substrate or the bottom electrode when using metal electrodes if e.g. a capacitor structure is intended to be fabricated as the layer structure or component.

Another expedient possibility for use of the method according to the invention is that of contact hole filling. In this case, since only the very thin intermediate layer is required for enabling the metal layer deposition, the conductivity of the contact to the underlying material can be significantly improved.

In order to avoid the situation in which the intermediate layer in some form or other influences the functioning of the layer structure and thus of the electronic component, it is expedient if said intermediate layer is applied extremely thin. The thickness of the intermediate layer should be only a few atomic layers in this case but the thickness should lie in the nm range. The deposition of the intermediate layer in an ALD method (Atomic Layer Deposition) is particularly preferred in this case. Layers deposited by this method guarantee a very good layer uniformity with an extremely low defect density and excellent edge coverage, these properties being important in particular for the filling of contact holes or the deposition of metal electrodes in trench capacitors. Furthermore, depositing the intermediate layer in an ALD method affords the possibility of exact control of the layer thickness.

A dielectric should expediently be used as the intermediate layer, for which e.g. Al, Ta, Hf, Ti or Zr oxides are suitable. Furthermore, it may be provided that a thermostable intermediate layer is used, which remains stable relative to subsequent thermal steps which ensue either in the context of production of the actual metallic or metal-containing layer or afterward. This is particularly expedient if, as envisaged, the intermediate layer is stabilized in a high-temperature step following its deposition.

It is expedient, furthermore, if an intermediate layer is used which enables a diffusion in the context of a subsequent silicide process serving for production of the metallic or metal-containing layer. In the context of this process, the layer production is effected by deposition of a metal layer on the intermediate layer and a subsequent diffusion process for siliconizing the deposited metal, something which is known sufficiently well. Since the diffusion of the component(s) involved takes place through the intermediate layer, the latter must necessarily be open to diffusion for the diffusing components.

In addition to the use of a thermostable layer, it is also possible to use a thermally unstable layer which decomposes in a subsequent, if appropriate further thermal step, in particular in the context of a subsequent silicide process serving for production of the metallic or metal-containing layer. Once the metal layer has been applied using the precursor, the intermediate layer, which then has the function of a sacrificial layer, is no longer absolutely necessary. If a silicide process follows, for example, the extremely thin intermediate layer may be broken up within this process and volatilize through the metal layer deposited on it without impairing the function of the layer structure.

In addition to the method according to the invention, the invention furthermore relates to an electronic component comprising a silicon- or germanium-containing layer and a metallic or metal-containing layer fabricated on the silicon- or germanium-containing layer by the described method according to the invention.

The component according to the invention is furthermore distinguished by the fact that the intermediate layer has a thickness of a few atomic layers, that is to say is very thin, and is expediently applied in an ALD method. The intermediate layer should expediently be a dielectric, preferably comprising an Al, Ta, Hf, Ti or Zr oxide, and preferably be stabilized in a thermal step.

Finally, it may be provided that the metallic or metal-containing layer is situated above, below or on both sides of the intermediate layer. The layer formation on both sides may be effected in particular in the context of a silicide process on the basis of the diffusion operations provided in this case.

BRIEF DESCRIPTION OF THE DRAWINGS

Further advantages, features and details of the invention emerge from the exemplary embodiments described below and also on the basis of the drawings, in which.

DETAILED DESCRIPTION OF THE INVENTION

Figure 1:
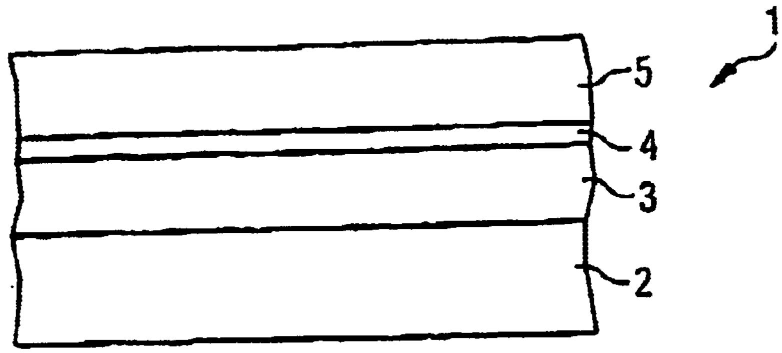
FIG. 1 shows a first layer construction according to the invention for forming a transistor structure.

FIG. 1 shows a detail from a component 1 according to the invention of a first embodiment as a diagrammatic sketch. In this exemplary embodiment, the intention is to realize a transistor structure having a gate dielectric and metal electrode. For this purpose, a gate dielectric 3 is produced on a substrate 2, e.g. bulk Si, in a standard CMOS process. By way of example, the substrate may be oxidized in order to form $SiO_2$ or a silicate may be deposited, which then forms the gate dielectric 3. Afterward, an intermediate layer 4 is applied to the gate dielectric, preferably in an ALD process. The intermediate layer 4 is made e.g. of $Al_2O_3$ and expediently has a thickness of only a few monolayers since the deposition in an ALD process can be carried out with very few defects and the thickness can be controlled very well. The intermediate layer 4 may subsequently be stabilized in a high-temperature step.

The gate electrode 5 is then deposited on the intermediate layer 4. By way of example, the gate electrode may be a tungsten-containing gate, where $WF_6$ may be used as precursor. The $WF_6$ precursor can be used since the intermediate layer 4 "seals" the underlying silicon-containing gate dielectric 3. The intermediate layer is diffusion-proof relative to the fluorine ions of the $WF_6$ precursor. If the $WF_6$ precursor were applied directly to the gate dielectric 3, then an etching attack with formation of $SiF_6$ would take place and the gate dielectric 3 would be incipiently etched. This is advantageously prevented by the very thin and low-defect intermediate layer 4, so that such aggressive precursors may be used. In addition, the intermediate layer 4 itself is etching-resistant relative to the precursor used, i.e. it is itself likewise not attacked.

Either W or WN or $WSi_x$ may be applied as the gate electrode 5 using the precursor. The subsequent CMOS process may be carried out as standard.

Figure 2:
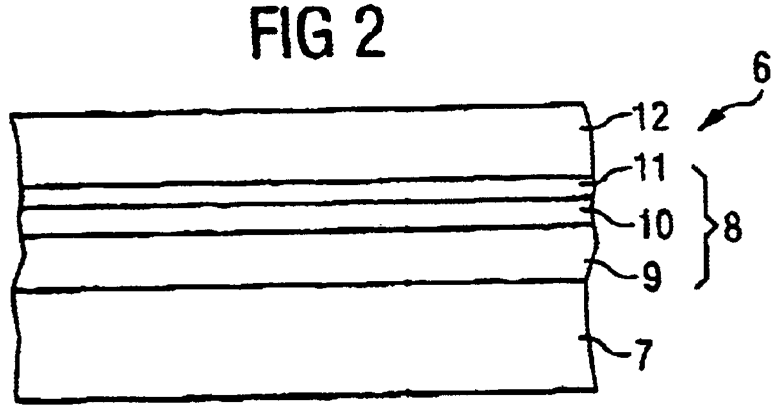
FIG. 2 shows a second layer construction according to the invention for forming a capacitor structure.

FIG. 2 shows a further exemplary embodiment of an electronic component 6 according to the invention. What is involved in this case is a capacitor structure as is used e.g. in a storage capacitor of a DRAM. The layer structure or the component 6 comprises a bottom electrode 7, which is formed either by heavy doping of a substrate (e.g. bulk Si) or by additional deposition of metal. A multi-layered layer structure 8 is applied to the bottom electrode 7 for the purpose of forming a node dielectric. In the exemplary embodiment shown, this dielectric comprises an $Si_3N_4$ layer 9 and an $SiO_2$ layer 10 applied thereto. The intermediate layer 11, hereto made e.g. of $Al_2O_3$ in the form of a few monolayers, is subsequently applied to the layer 10. The layers 9, 10, 11 together form the node dielectric. Hereto the layer 11 is preferably deposited in an ALD process. The upper metal layer is subsequently deposited in the form of the metal electrode 12, which may be e.g. a tungsten-containing electrode which has been fabricated using $WF_6$ as precursor. Hereto an attack of the aggressive $WF_6$ precursor at the $SiO_2$ layer 10 is prevented by the use of the extremely thin, etching-resistant intermediate layer 11. Hereto the latter may optionally have been stabilized by a preceding high-temperature step. The further integration ensues according to the known standard process.

Figure 3:
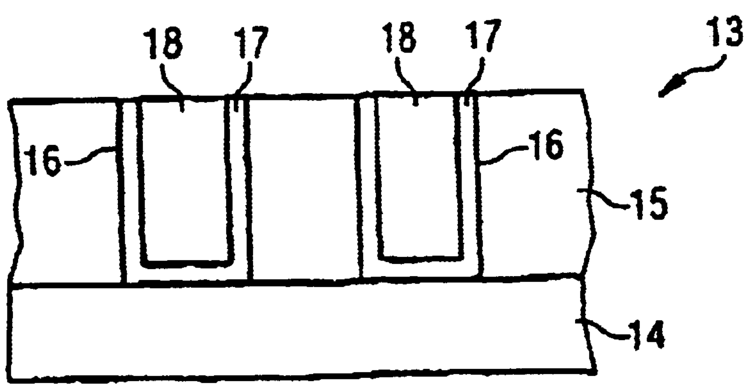
FIG. 3 shows a diagrammatic sketch for illustrating the fabrication of a contact hole structure of a first embodiment.

FIG. 3 shows a further exemplary embodiment for the fabrication of a contact hole structure of a component 13 in the form of a diagrammatic sketch. Firstly an oxide layer 15 is produced on a substrate 14, preferably made of Si, and contact holes 16 are subsequently etched into the said oxide layer. Afterward, an intermediate layer 17 having a very small thickness (hereto once again only a few atomic layers) is deposited into the contact holes 16 in an ALD process. The ALD process is expedient particularly with regard to the extremely good edge coverage of the intermediate layer 17 thus produced. After the production of the intermediate layer 17, the contact holes 16 are filled with metal-containing material 18, e.g. with WN and $WF_6$ as precursor, which is deposited by means of a CVD method. The layer construction according to the invention with the very thin, etching-resistant intermediate layer 17 thus results hereto. Hereto neither the $SiO_2$ layer 15 nor the underlying silicon-containing substrate 14 is attacked by the precursor, since this is prevented by the intermediate layer 17. A further advantage of the very thin intermediate layer 17 applied by the ALD method is to be seen in the fact that, as explained, the layer 17 can be deposited extremely thin, which is advantageous for the conductivity of the contact.

After the introduction of the WN material 18, the nitrogen of the WN layer 18 can be outgased in a subsequent annealing step, so that the contact hole is ultimately filled with largely nitrogen-free W.

Figure 4:
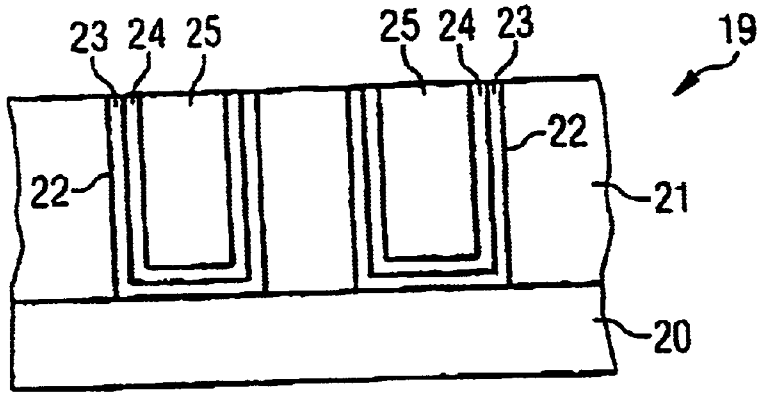
FIG. 4 shows a diagrammatic sketch for illustrating the fabrication of a contact hole structure of a second embodiment.

FIG. 4 shows a further embodiment of a component 19, which likewise exhibits a contact hole structure and, in the same way as the component 13 from FIG. 3, comprises an expediently silicon-containing substrate 20 and also an applied silicon-containing oxide layer 21. After the etching of the contact holes 22, hereto an intermediate layer 23, preferably $Al_2O_3$, is applied in an ALD process. Afterward, the contact hole is firstly deposited with a very thin WN layer 24 using a $WF_6$ precursor on the intermediate layer 23, which serves as a diffusion barrier, after which the contact hole is filled with a thick tungsten layer 25. Such a layer construction too is possible only on account of the use of the extremely thin intermediate layer 23.

Figure 5A:
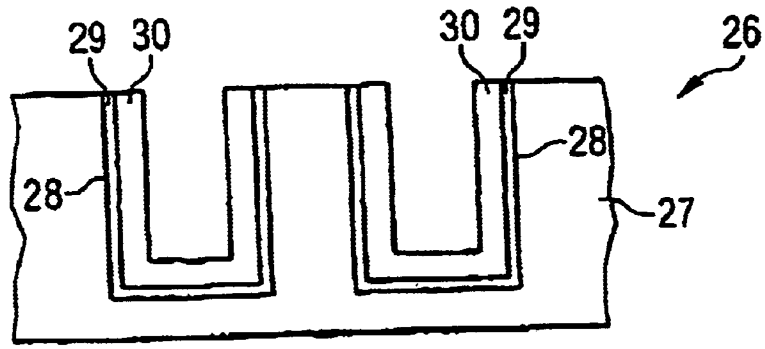
FIGS. 5*a*, 5*b*, 5*c* show diagrammatic sketches for illustrating a deep trench bottom electrode through silicide formation.
Figure 5B:
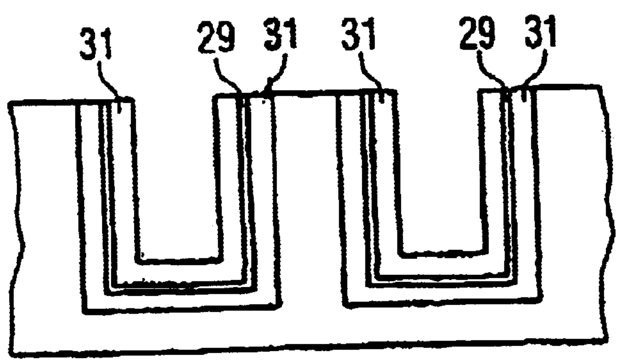
Figure 5C:
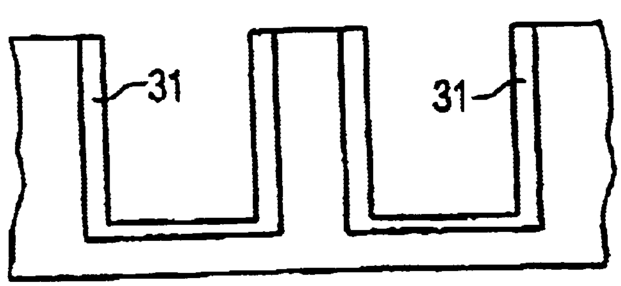

Finally, FIGS. 5*a*, 5*b* and 5*c* show a further exemplary embodiment according to the invention of a component 26. The figures describe the introduction of a sacrificial layer during the silicide formation of a deep trench bottom electrode of the component 26. Firstly, trenches 28 are etched into a preferably silicon-containing substrate 27 (a germanium-containing substrate may equally be used as well, and this equally applies with regard to the exemplary embodiments described above), said trenches subsequently being covered at the walls with a very thin intermediate layer 29 having a thickness of a few monolayers. The intermediate layer 29 may be e.g. $Ta_2O_5$ in this case.

A metallic layer 30, e.g. made of tungsten, is subsequently deposited on to the intermediate layer 29. Hereto the intermediate layer prevents the reaction between the precursors used and the substrate 27 during the subsequent deposition of a metal layer. In a subsequent silicide process, a simultaneous diffusion of the tungsten and of the silicon then takes place through the intermediate layer 29, which has the effect—see FIG. 5*a*—that a $WSi_x$ layer 31 forms in a manner governed by diffusion on both sides of the intermediate layer 29. Afterwards, as shown in FIG. 5*c*, the upper silicide layer 31 may be etched away by selected etching, in which case the intermediate layer 29 may also additionally be concomitantly removed in this etching process, so that ultimately all that remains is the silicide layer 31 which, on the basis of FIG. 5*b*, is situated below the intermediate layer 29. As a result, the thickness of the metal layer forming the electrode is significantly reduced and the diameter of the trench is increased again. The deposition of the node dielectric and also of the upper top electrode and further standard integration are subsequently effected.

Instead of the embodiments shown in FIGS. 5*a*–5*c*, it is also conceivable to choose, instead of a thermostable intermediate layer, a thermally unstable layer which decomposes in the context of the silicide process and is broken up in this case and volatilizes through the previously applied metal layer. An etching process following the silicide formation finally serves only for reducing the silicide layer.

All silicon- or germanium-containing layers and also their oxides, nitrides or carbides and also metal silicides or metal silicates, which in each case likewise contain Si, may be used as the substrate to which the intermediate layer and finally the metal-containing and metallic layer are to be applied. By way of example, $Al_2O_3$, $Ta_2O_5$, $HfO_2$, $TiO_2$ or $ZrO_2$ may be used in diverse stoichiometries as dielectrics that form the intermediate layer. All metals having a high melting point and also their nitrides and silicides such as W, Ti, Ta, Pd, Pt, V, Cr, Zr, Nb, Mo, Hf, Co, Ni, Rh, RhO, Ir and also other metals such as Al, Cu, Ag, Fe can be used as metals. The corresponding precursor is chosen depending on which metal or which metallic layer is to be applied. The respective dielectric that forms the intermediate layer is then also expediently to be chosen depending on this with regard to its diffusion-blocking and etching-resistant properties.

What is claimed is:

1. A method for production of a metallic or metal-containing layer using a precursor on a silicon- or germanium-containing layer of an electronic component, the method comprising:

(a) applying an intermediate layer to the silicon- or germanium-containing layer before the precursor is used, said intermediate layer forming a diffusion barrier at least for the elements of the precursor which would etch the silicon- or germanium- containing layer and itself being etching-resistant relative to the precursor, wherein the intermediate layer is applied with a thickness of a few atomic layers in an ALD method, wherein an intermediate layer is used which enables a diffusion in the context of a subsequent silicide process serving for production of the metallic or metal-containing layer; and (b) after the silicide process has been carried out, removing the metallic or metal-containing layer lying above the intermediate layer and, if appropriate, also the intermediate layer by etching which is selective with respect to the intermediate layer.

2. The method as claimed in claim 1, wherein a dielectric is used as the intermediate layer.

3. The method as claimed in claim 2, wherein an Al, Ta, Hf, Ti or Zr oxide is used as the dielectric.

4. The method as claimed in claim 1, wherein a thermostable intermediate layer is used.

5. The method as claimed in claim 1, wherein the intermediate layer is stabilized in a thermal step.

6. The method as claimed in claim 1, wherein a thermally unstable layer is used, which decomposes in a subsequent, if appropriate further thermal step, in particular in the context of a subsequent silicide process serving for production of the metallic or metal-containing layer.

7. An electronic component comprising a silicon- or germanium-containing layer and a metallic or metal-containing layer fabricated on the silicon- or germanium-containing layer by the method as claimed in claim 1.

8. The electronic component as claimed in claim 7, wherein the metallic or metal-containing layer is situated above, below or on both sides of the intermediate layer.

9. A method for production of a metallic or metal-containing layer using a precursor on a silicon-or germanium- containing layer of an electronic component, the method comprising applying an intermediate layer to the silicon- or germanium-containing layer before the precursor is used, said intermediate layer forming a diffusion barrier at least for the elements of the precursor which would etch the silicon-or germanium-containing layer and itself being etching-resistant relative to the precursor, wherein the intermediate layer is applied with a thickness of a few atomic layers in an ALD method, wherein a thermally unstable layer is used, which decomposes in a subsequent, if appropriate further thermal step, in particular in the context of a subsequent suicide process serving for production of the metallic or metal-containing layer.

* * * * *